(12) United States Patent
Wong et al.

(10) Patent No.: US 10,050,131 B2
(45) Date of Patent: Aug. 14, 2018

(54) METHOD OF FORMING A POLYSILICON SIDEWALL OXIDE REGION IN A MEMORY CELL

(71) Applicant: Microchip Technology Incorporated, Chandler, AZ (US)

(72) Inventors: Jack Wong, Phoenix, AZ (US); Sajid Kabeer, Tempe, AZ (US); Mel Hymas, Camas, WA (US); Santosh Murali, Phoenix, AZ (US); Brad Kopp, Beaverton, OR (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 21 days.

(21) Appl. No.: 15/375,094

(22) Filed: Dec. 11, 2016

(65) Prior Publication Data
US 2017/0170303 A1    Jun. 15, 2017

Related U.S. Application Data

(60) Provisional application No. 62/265,660, filed on Dec. 10, 2015.

(51) Int. Cl.
*H01L 29/66* (2006.01)
*H01L 29/788* (2006.01)
(Continued)

(52) U.S. Cl.
CPC .... *H01L 29/66825* (2013.01); *H01L 21/0217* (2013.01); *H01L 21/02164* (2013.01);
(Continued)

(58) Field of Classification Search
CPC ............ H01L 29/66825; H01L 29/788; H01L 29/7881; H01L 29/42328; H01L 29/42324;
(Continued)

(56) References Cited

U.S. PATENT DOCUMENTS 6,103,576 A     8/2000  Deustcher et al. .......... 438/261
6,803,622 B2 * 10/2004  Matsuno ............... H01L 27/115
                                              257/314

(Continued)

OTHER PUBLICATIONS

International Search Report and Written Opinion, Application No. PCT/US2016/066101, 12 pages, dated Mar. 14, 2017.

*Primary Examiner* — Michael Trinh
(74) *Attorney, Agent, or Firm* — Slayden Grubert Beard PLLC

(57) ABSTRACT

Methods of fabricating a memory cell of a semiconductor device, e.g., an EEPROM cell, having a sidewall oxide are disclosed. A memory cell structure may be formed including a floating gate and an ONO film over the conductive layer. A sidewall oxide may be formed on a side surface of the floating gate by a process including depositing a thin high temperature oxide (HTO) film on the side surface of the conductive layer, and performing a rapid thermal oxidation (RTO) anneal. The thin HTO film may be deposited before or after performing the RTO anneal. The sidewall oxide formation process may provide an improved memory cell as compared with known prior art techniques, e.g., in terms of endurance and data retention.

19 Claims, 9 Drawing Sheets

(51) Int. Cl.
*H01L 21/02* (2006.01)
*H01L 29/423* (2006.01)
*H01L 21/28* (2006.01)

(52) U.S. Cl.
CPC .. *H01L 21/02318* (2013.01); *H01L 21/02323* (2013.01); *H01L 21/02337* (2013.01); *H01L 21/28273* (2013.01); *H01L 29/42324* (2013.01); *H01L 29/42328* (2013.01); *H01L 29/7881* (2013.01)

(58) Field of Classification Search
CPC ......... H01L 27/11524; H01L 27/11521; H01L 21/02318; H01L 21/02323; H01L 21/02337; H01L 21/28273
See application file for complete search history.

(56) References Cited

U.S. PATENT DOCUMENTS

| | | | | |
|---|---|---|---|---|
| 2003/0036253 | A1* | 2/2003 | Ajmera | H01L 21/28061 438/585 |
| 2005/0227437 | A1* | 10/2005 | Dong | H01L 21/28273 438/265 |
| 2008/0248620 | A1 | 10/2008 | Liu et al. | 438/257 |
| 2011/0006355 | A1* | 1/2011 | Shen | H01L 27/11521 257/316 |

\* cited by examiner

METHOD OF FORMING A POLYSILICON SIDEWALL OXIDE REGION IN A MEMORY CELL

RELATED PATENT APPLICATION

This application claims priority to commonly owned U.S. Provisional Patent Application No. 62/265,660; filed Dec. 10, 2015; which is hereby incorporated by reference herein for all purposes.

TECHNICAL FIELD

The present disclosure relates to semiconductor manufacturing, in particular to a method of forming a polysilicon sidewall in a memory cell, e.g., a merged two transistor memory cell having a dielectric layer, which includes an ONO stack film and a stacked oxide sidewall located between a floating gate of the memory transistor and the gate shared between the memory transistor and the select transistor.

BACKGROUND

EEPROM (Electrically Erasable Programmable Read Only Memory) cells are a class of nonvolatile semiconductor memory in which information may be electrically programmed into and erased from each memory element or cell. Floating gate EEPROM cells are one type of EEPROM cell in which information is stored by placing electronic charge on a "floating gate", typically a region of conductive polysilicon that is electrically isolated from other conducting regions of the device by insulating dielectric layers that surround it. The charge on the floating gate can be detected in reading the memory cell because it changes the threshold voltage of the memory transistor. This change in threshold voltage changes the amount of current that flows through the cell when voltages are applied to it during the read operation and the current can be detected by a sense amplifier circuit.

As stated above, EEPROM cells are nonvolatile, which means that they must retain their information (charge state) even when the power supplied to them is turned off. Thus, it is critically important that the charge stored on the floating gate not "leak" off over time. A product containing EEPROM cells usually has a retention specification in its data sheets which states how long the EEPROM memory cells will retain the information programmed into them without error when the power supplied to them is turned off. The dielectric isolation surrounding the floating gate must have very good integrity and this integrity must exist with respect to all of the cells in the memory device.

The charge on the floating gate is typically controlled by a "control gate," which may be isolated from the floating gate by a 3-layer stack of dielectrics referred to as the "ONO", which consists of a bottom layer of silicon dioxide, a middle layer of silicon nitride (Si3N4), and top layer of silicon dioxide, wherein the ONO provides a dielectric isolation between the floating and control gates.

The sidewall of the floating gate is typically sealed to prevent the leakage of charge (voltage) from the floating gate. This seal is commonly provided by a thermal polyoxide formed on the floating gate sidewall, referred to herein as the "sidewall oxide." The sidewall oxide may be defined by a vertical portion of a stacked oxide layer. FIG. 1 shows a partial cross-sectional representation of a conventional EEPROM cell, showing a conductive floating gate 28 formed over a silicon substrate 16, and separated from the silicon substrate 16 by a gate or tunnel oxide 42. A dielectric or ONO layer 32, including a silicon nitride (Si3N4) layer 108 between a pair of oxide layers, is formed on top of the floating gate 28, and a control gate (not shown in FIG. 1) may be formed over the ONO and underlying floating gate 28.

A sidewall oxide 114 may be formed over a side surface or wall 40 of the floating gate 28, for inhibiting voltage leakage from the floating gate 28. The sidewall oxide 114 may form a portion of a contiguous oxide layer extending above the ONO layer 32 and/or onto an upper surface of the substrate adjacent the floating gate 28, depending on the particular design. Different techniques have been used to form the sidewall oxide 114, which suffer from various drawbacks. For example, the process of forming the sidewall oxide may result in the unwanted growth of oxide under the floating gate 28, which may reduce the effective area of the gate oxide 42, and/or unwanted oxide growth of oxide underneath the ONO dielectric (e.g., by oxidation of the top surface of the floating gate 28), thereby effectively thickening the ONO and decreasing the coupling capacitance of the cell. As another example, some processes for forming the sidewall oxide may produce a non-uniform, e.g., outwardly bulging, shape of the sidewall oxide, and/or may result in sharp corners of the polysilicon control gate, both of which are generally undesirable.

FIG. 2 illustrates an image of an example EEPROM structure exhibiting the undesirable features discussed above. In this example the sidewall oxide was formed by a two-step process of depositing a thin high temperature oxide (HTO) film, followed by a furnace oxidation anneal. As shown, the resulting structure exhibits (a) undesirable oxide lateral encroachment into the ONO region, as indicated at regions A, (b) undesirable oxide encroachment under the floating gate, as indicated at regions B, resulting in an increase in the effective tunnel oxide thickness and a decrease in the tunneling channel area, (c) undesirably sharp corners of the Poly 2 layer (control gate), as indicated at C, and (d) a non-uniform thickness of the sidewall oxide, in particular defining an outward bulge, as indicated at D.

SUMMARY

Embodiments of the present disclosure provide methods of forming a polysilicon sidewall oxide on the sidewall of a conductive layer in a memory cell, e.g., a sidewall oxide on the floating gate of an EEPROM cell, wherein the sidewall oxide formation process may provide an improved memory cell as compared with known techniques, e.g., in terms of endurance and data retention. Other embodiments provide a memory cell having such a polysilicon sidewall oxide formed according to the disclosed methods.

Some embodiments provide a method of fabricating a memory cell of a semiconductor device, including depositing a conductive layer having a top surface and a side surface; forming an ONO layer over the top surface of the conductive layer; and forming a sidewall oxide layer adjacent the side surface of the conductive layer by a process including: depositing a thin high temperature oxide (HTO) film on the side surface of the conductive layer; and performing a rapid thermal oxidation (RTO) anneal. In one embodiment, the thin HTO film is deposited before performing the RTO anneal. In another embodiment, the RTO anneal is performed before depositing the HTO film.

In one embodiment, the deposited thin HTO film has a thickness in the range of 50-120 Å, e.g., in the range of 60-80 Å.

In some embodiments, the RTO anneal is performed in a dry $O_2$ environment, in the temperature range of 1000° C.-1200° C. for a duration in the range of 25-60 sec.

In one embodiment, the RTO anneal is performed in a dry $O_2$ environment, in the temperature range of 1050° C.-1150° C. (e.g., 1100° C.) for a duration in the range of 30-40 sec.

BRIEF DESCRIPTION OF THE FIGURES

Example aspects and embodiment of the invention are described below with reference to the drawings, in which.

DETAILED DESCRIPTION

Embodiments of the present invention provide methods of forming a polysilicon sidewall oxide on the sidewall of a conductive layer in a memory cell, e.g., a sidewall oxide on the floating gate of an EEPROM cell. The disclosed methods of forming the sidewall oxide formation provides an improved memory cell as compared with known prior art techniques.

The disclosed methods may be applied to any suitable memory cell, e.g., an EEPROM cell or other memory cell having a conductive layer with a sidewall oxide, e.g., for inhibiting the leakage of voltage from the conductive layer.

Figure 3:
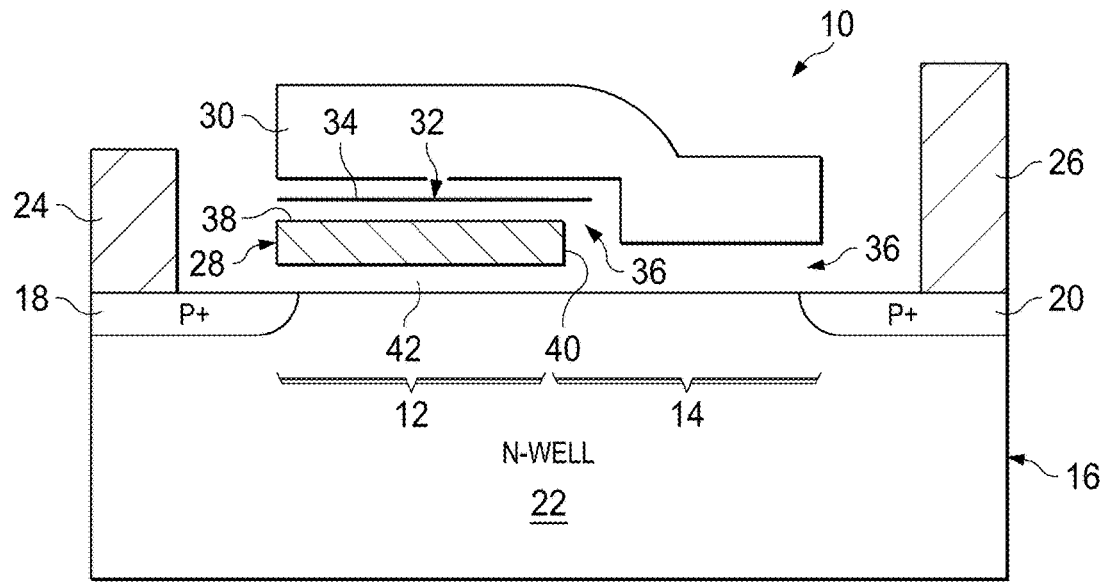
FIG. 3 is a cross-sectional view of a p-channel split-gate cell of an EEPROM, having a sidewall oxide formed according to the present invention.
Figure 4:
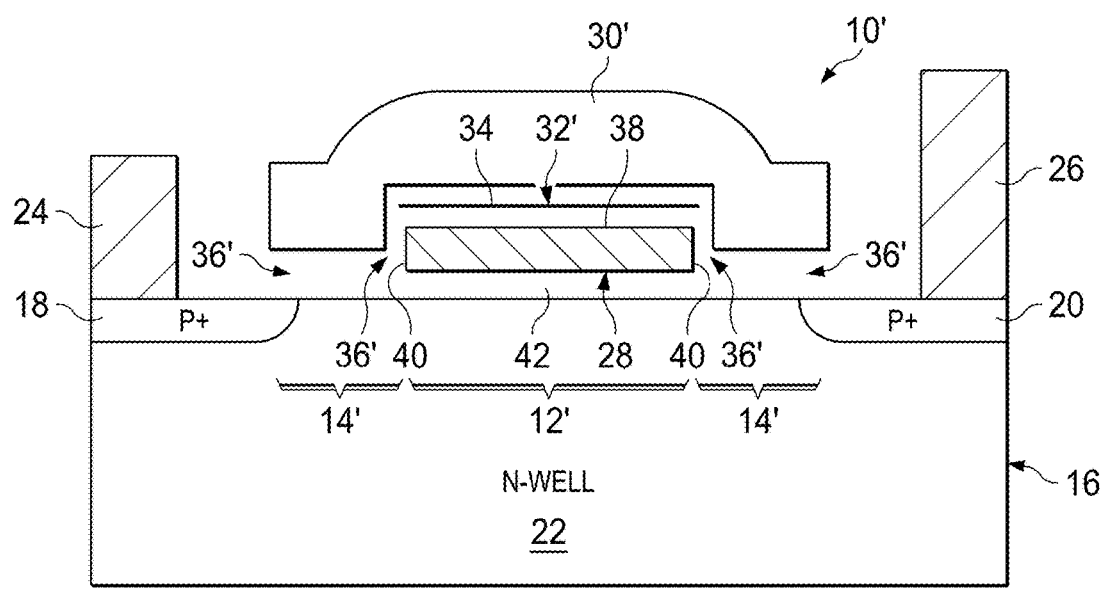
FIG. 4 is a cross-sectional view of a p-channel split-gate cell of an EEPROM having a select transistor channel that is split on either side of the memory transistor, and having a sidewall oxide formed according to the present invention.

Two example EEPROM cells incorporating the sidewall oxide formed according to the disclosed methods are shown in FIGS. 3 and 4.

FIG. 3 illustrates a p-channel split-gate memory cell 10 of an EEPROM device according to one embodiment of the present invention. The memory cell 10 may include a memory transistor 12 and select transistor 14 formed on a silicon substrate 16. The substrate 16 may be defined by p-channels 18 and 20 and N-well 22. Reference numeral 24 may refer to a metal source contact, which may be disposed on p-channel 18, and reference numeral 26 may refer to a metal bitline (drain) contact, disposed on p-channel 20.

The memory transistor 12 may include a first conductive layer defining a floating gate 28, and a second conductive layer defining a control gate 30, which is shared with the select transistor 14, and a dielectric layer 32 disposed between the floating gate 28 and the control or shared gate 30, as shown in FIG. 3. The dielectric layer 32 may comprise an ONO film 34 and a stacked oxide layer 36 defining oxide layers above and below the ONO film 34. The dielectric layer 32 may thus be referred to as ONO layer 32. The stacked oxide layer 36 may have a vertical portion and a horizontal portion. The floating gate 28 has a top surface 38 and a side surface 40.

The ONO layer 32 is disposed between the floating gate 28 and shared gate 30, adjacent to the top surface 38 of the floating gate. The vertical portion of the stacked oxide layer 36 is disposed between the floating gate 28 and the shared gate 30, adjacent to a portion of the side surface 40 of the floating gate 28. The vertical portion of the stacked oxide layer, referred to herein as the "sidewall oxide" inhibits the leakage of charge from the side surface 40 of the floating gate 28. The sidewall oxide on the side surface 40 of the floating gate 28 may be formed by a process as disclosed herein, e.g., by depositing a thin high temperature oxide (HTO) film on the side surface 40 of the floating gate 28, followed by a rapid thermal oxidation (RTO) anneal of the structure, or alternatively, by performing an RTO followed by deposition of an HTO film.

The horizontal portion of the stacked oxide layer 36 is disposed between the shared gate 30 and the substrate 16, and serves as the thermal gate oxide for the select transistor. Because this layer does not contain silicon nitride, it does not trap electrons, and thus inhibits threshold voltage drift of the select transistor 14.

The select transistor 14 may include a wordline 30, which, as noted above, is also the gate shared with the memory transistor 12. A gate oxide 42 may also be provided between the floating gate 28 and the silicon substrate 16.

FIG. 4 illustrates another embodiment, in which the shared gate 30' is split on either side of the floating gate 28, i.e., the shared gate 30' surrounds the entire side surface 40 of the floating gate. In this embodiment, the vertical portion of the stacked oxide layer 36' is disposed adjacent to the entire side surface 40 of the floating gate 28. Also, the horizontal portion of the stacked oxide layer 36' is disposed between the shared gate 30' and the substrate 16 on all sides of the floating gate 28.

As with the sidewall oxide in the embodiment shown in FIG. 3, the sidewall oxide on the side surface 40 of the floating gate 28 in the embodiment of FIG. 4 may be formed by a process as disclosed herein, e.g., by depositing a thin high temperature oxide (HTO) film on the side surface 40 of the floating gate 28, followed by a rapid thermal oxidation (RTO) anneal of the structure, or alternatively, by performing an RTO followed by deposition of an HTO film.

The EEPROM cells shown in FIGS. 3 and 4 are only two example implementations of the present invention. The disclosed methods may be incorporated in any other suitable EEPROM cell or other memory cell having a sidewall oxide.

FIGS. 5A-5D illustrate an example process for forming an EEPROM memory cell 10 having a floating gate, a control gate, and a floating gate sidewall oxide formed according to one embodiment of the present invention.

Figure 5A:
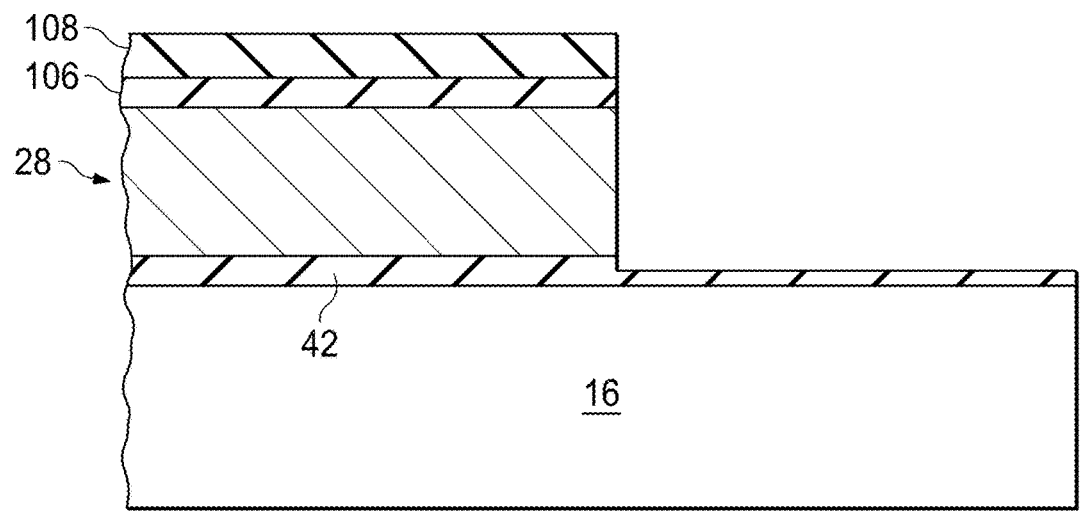
FIGS. 5A-5D illustrate an example process for forming a sidewall oxide on the side of an EEPROM floating gate, and a control gate over the floating gate, according to one embodiment.

After other steps in the process of manufacturing memory cell 10 have been performed, such as well formation, device isolation, threshold adjust implants, etc., the gate oxide 42 of the memory transistor 12 may be formed in any suitable manner, e.g., by growing a $SiO_2$ layer 42 on substrate 16, which is formed of silicon (Si), as shown in FIG. 5A. Layer 42 may also be a tunnel oxide and may have any suitable thickness, e.g., in the range of 60-120 Å. The floating gate 28 of the memory transistor and ONO film may then be formed in any suitable manner. For example, a polysilicon or amorphous polysilicon layer 104 may be deposited on the gate oxide 42, and doped with n- or p-dopants to make it conductive, e.g., by annealing in a furnace using ($POCl_3$) gas, by doping the polysilicon layer 104 in-situ when deposited, or by ion implantation of the appropriate dopant species into the polysilicon layer 104, for example.

Next, an $SiO_2$ layer 106, e.g., with a thickness in the range of 60-120 Å, may be deposited on the polysilicon layer 104. In some embodiments, the layer 106 may be thermally annealed, e.g., between 800-1000° C. to densify and improve the insulating quality of the oxide. This layer becomes the bottom oxide of the ONO layer 32 disposed on the top surface of the floating gate 28. Next, a silicon nitride ($Si_3N_4$) layer 108, e.g., with a thickness in the range of 60-200 Å, is deposited on the $SiO_2$ layer 106. This layer becomes the silicon nitride layer of the ONO layer 32.

Next, a protective photoresist layer may be deposited on the stack and patterned with a mask to define the floating gate 28. The stack of films may then be anisotropically etched down to an $SiO_2$ layer 42 on top of the substrate 16, resulting in the structure shown in FIG. 5A.

The wafer may then be cleaned using a standard wet chemical process, a dry plasma process, or other suitable process known to those of ordinary skill in the art.

Figure 5B:
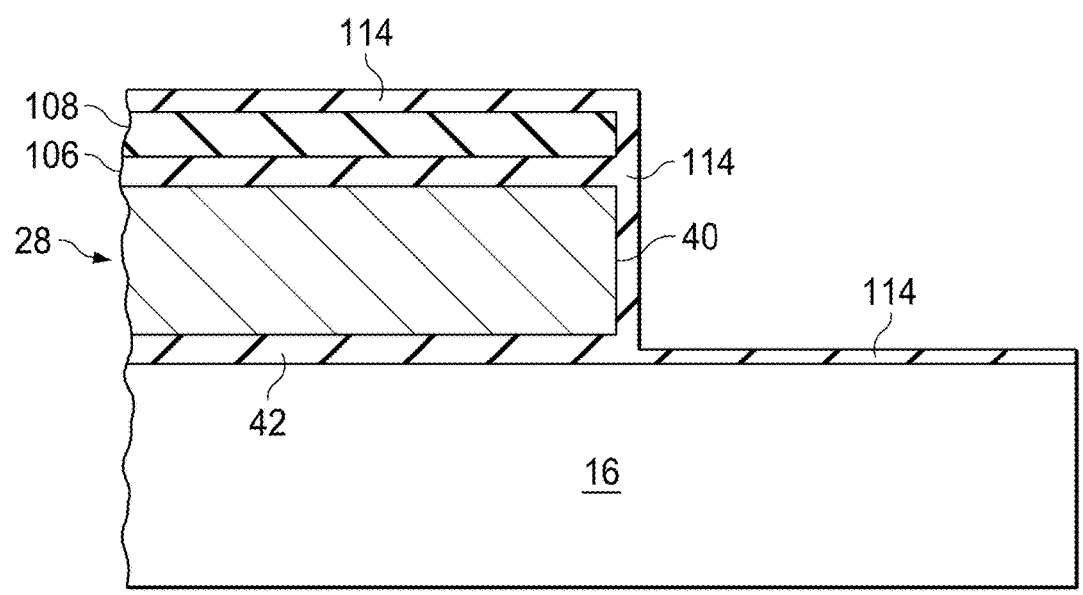
Figure 5C:
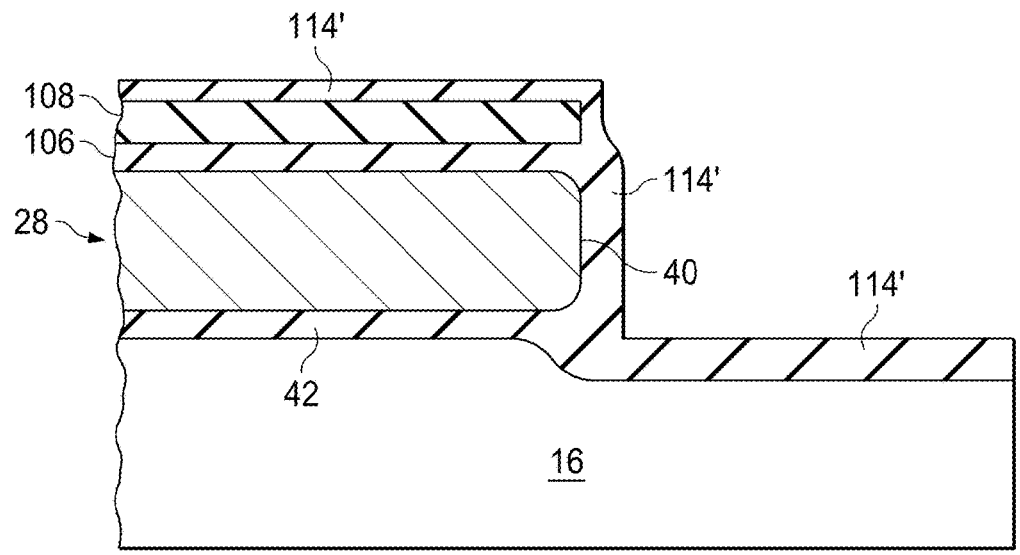

As shown in FIG. 5B, a thin high temperature oxide (HTO) layer ($SiO_2$) 114 is deposited over the stack, e.g., with a thickness between 50 and 120 Å, (e.g., between 60 Å and 80 Å, and in one example embodiment, about 70 Å thick. As shown, the HTO layer may be deposited over the $Si_3N_4$ layer 108, the vertical side surface 40 of the floating gate 28, and the gate oxide 42.

A rapid thermal oxidation (RTO) may then be performed to anneal and densify the HTO oxide 114. The RTO may be performed using any suitable parameters or recipe. In some embodiments, the RTO anneal is performed in a dry $O_2$ environment, in the temperature range of 1000° C.-1200° C. for a duration in the range of 25-60 sec. In certain example embodiments, the RTO anneal is performed in a dry $O_2$ environment, in the temperature range of 1050° C.-1150° C. for a duration in the range of 30-40 sec.

The RTO step causes oxidation of the structure, including lateral oxidation of the floating gate 28 and vertical oxidation of the uncovered portion of the substrate 16, to thereby increase the thickness of the oxide layer 114. The resulting (thickened) oxide layer is indicated as 114' in FIG. 5C, which includes (a) a lateral portion over the $Si_3N_4$ layer 108 which forms the top of the ONO layer 32, (b) a vertical sidewall oxide portion adjacent the side surface 40 of the floating gate 28, and (c) a lateral portion over the portion of the substrate 16 uncovered by the floating gate 28.

The lateral oxidation of the floating gate 28 due to the RTO step may be more uniform than other conventional techniques, and may cause less lateral oxide encroachment under the floating gate 28 (which undesirably thickens the tunnel oxide 42) and between the floating gate 28 and $Si_3N_4$ layer 108 (which undesirably thickens the ONO layer 32) as compared with conventional techniques.

In some embodiments, the total thickness of the $SiO_2$ layer 114' following the RTO may be between 50 Å and 120 Å (e.g., between 60 Å and 80 Å) above the Si3N4 layer 108, between 100 and 500 Å (e.g., between 200 Å and 400 Å) on the side surface 40 of the floating gate 28 (i.e., the sidewall oxide), and between 100 and 300 Å (e.g., between 200 Å and 250 Å) above the substrate 16.

Figure 5D:
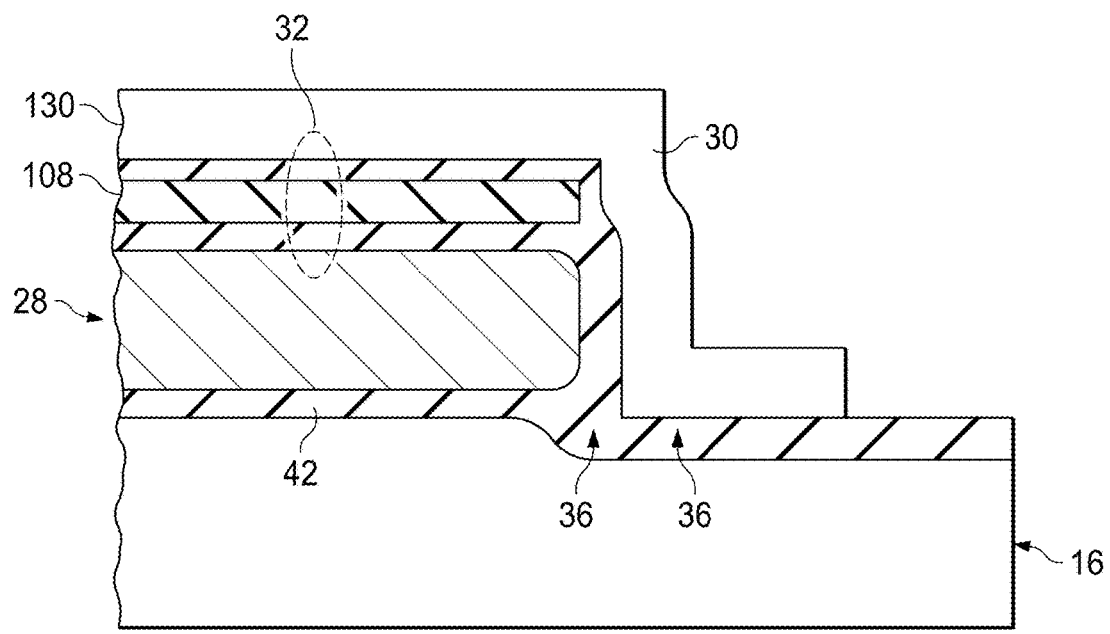

Next, the control gate (or shared gate) 30 of the EEPROM may be formed in any suitable manner, as illustrated in FIG. 5D. For example, a polysilicon or amorphous polysilicon layer 130 may be deposited on the ONO layer 32 and select transistor gate oxide (the horizontal portion of layer 36'), and doped with n- or p-dopants to make the polysilicon layer conductive. Remaining steps to form remaining components of the memory cell, such as formation of source and drain regions and metal interconnect, can then be done to complete the fabrication process.

FIGS. 6A-6D illustrate another example process for forming an EEPROM memory cell 10 having a floating gate, a control gate, and a floating gate sidewall oxide formed according to another embodiment of the present invention. The embodiment of FIGS. 6A-6D is generally similar to the embodiment of FIGS. 5A-5D, except the rapid thermal oxidation (RTO) step is performed before (rather than after) depositing the thin high temperature oxide (HTO) film.

Figure 6A:
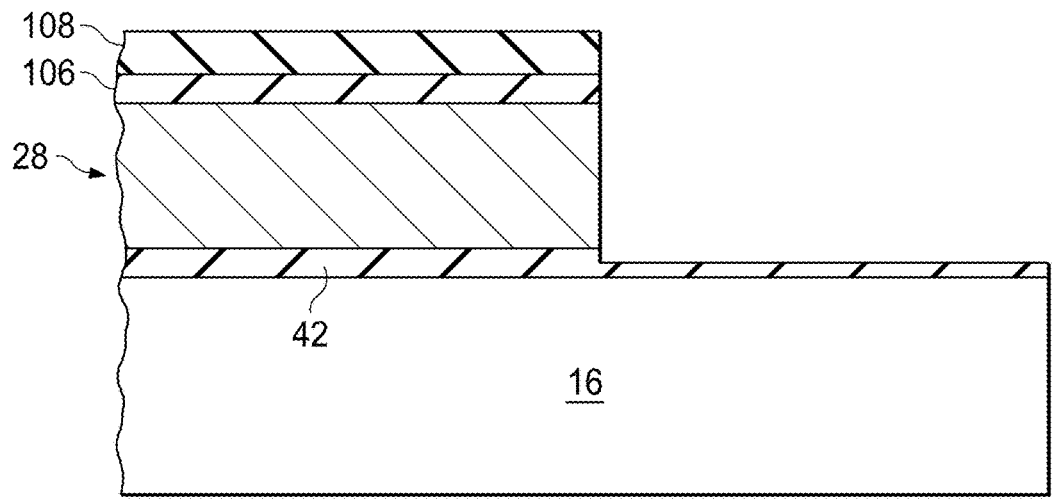
FIGS. 6A-6D illustrate another example process for forming a sidewall oxide on the side of an EEPROM floating gate, and a control gate over the floating gate, according to another embodiment.

The process of forming the structure shown in FIG. 6A is similar to that described above with respect to FIG. 5A, and thus FIG. 6A is identical to FIG. 5A.

Figure 6B:
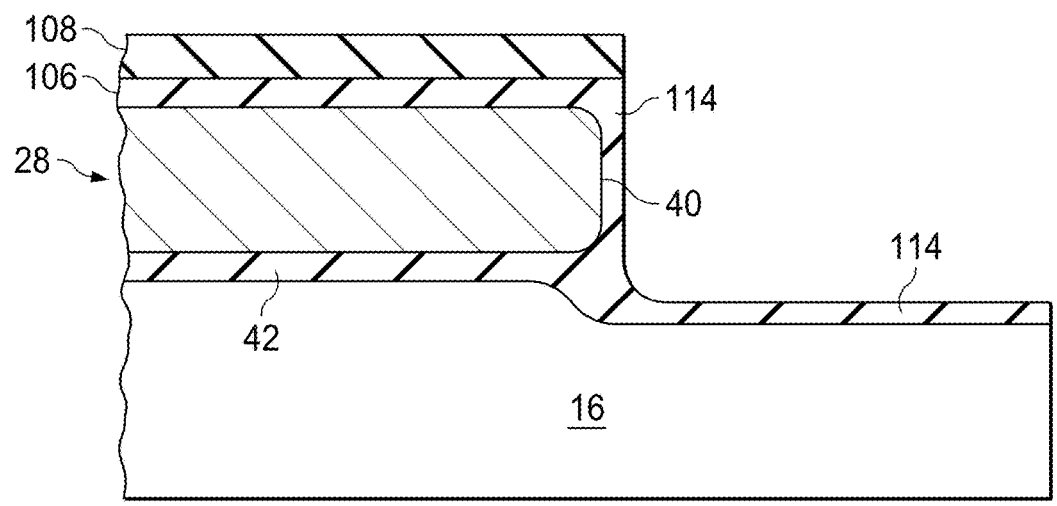

In this embodiment, the rapid thermal oxidation (RTO) may be performed on the structure shown in FIG. 6A, which may result in the structure shown in FIG. 6B. As shown in FIG. 6B, the RTO may cause lateral oxidation of the floating gate 28 and vertical oxidation of the uncovered portion of the substrate 16, to thereby define an oxide layer 114. The RTO anneal may be performed using any suitable parameters or recipe, e.g., any of the parameters or recipes disclosed above with respect to FIG. 5C.

Figure 6C:
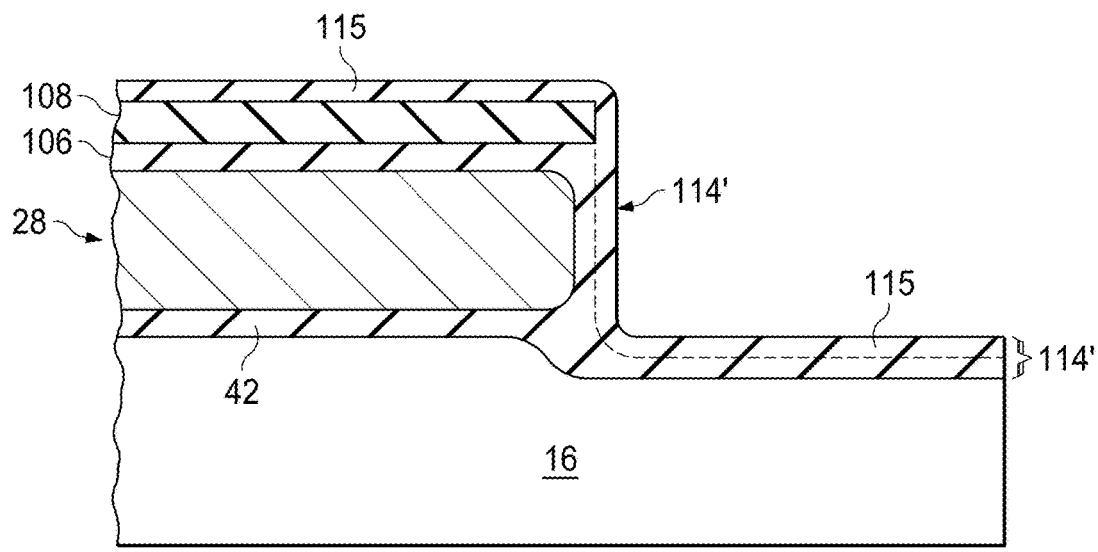

After the RTO, a thin high temperature oxide (HTO) film ($SiO_2$) 115 is deposited over the stack, as shown in FIG. 6C. As shown, the HTO layer may be deposited over the $Si_3N_4$ layer 108 and over the oxide layer 114 formed adjacent the floating gate 28 and substrate 16 by the RTO process. In some embodiments, the HTO film 115 may have a thickness between 50 and 120 Å (e.g., between 60 Å and 80 Å, and in one example embodiment, about 70 Å thick). The thin HTO film 115 may combine with the oxide layer 114 formed by the RTO to define an oxide layer 114', as shown in FIG. 6C. In some embodiments, the total thickness of the oxide layer 114' may be between 100 and 500 Å (e.g., between 200 Å and 400 Å) on the side surface 40 of the floating gate 28 (i.e., the sidewall oxide), and between 100 and 300 Å (e.g., between 200 Å and 250 Å) above the substrate 16.

Figure 6D:
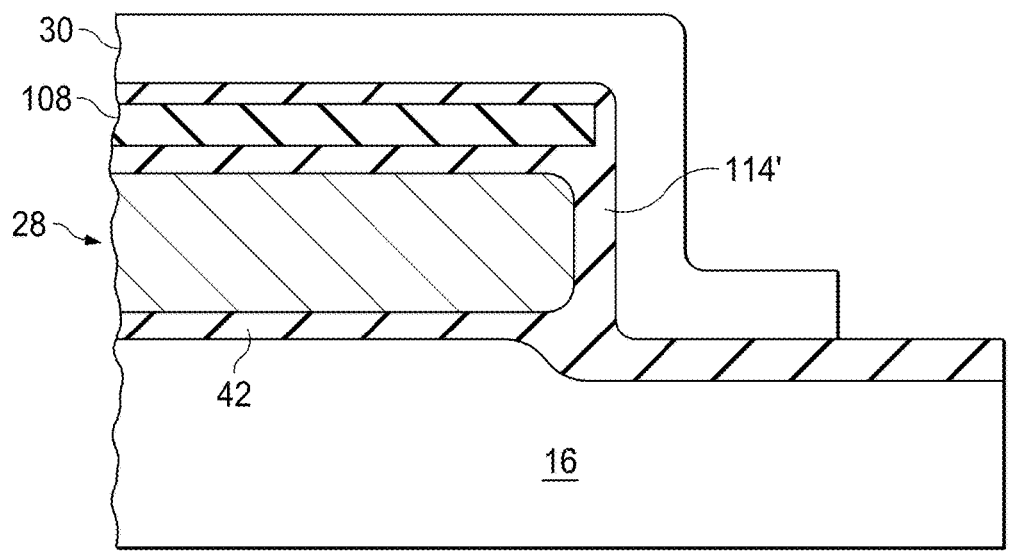

As shown in FIG. 6D, a control gate (or shared gate) 30 may then be formed over the structure in any suitable manner, e.g., using techniques discussed above regarding FIG. 5D. Remaining steps to form remaining components of the memory cell, such as formation of source and drain regions and metal interconnect, can then be done to complete the fabrication process.

Figure 7:
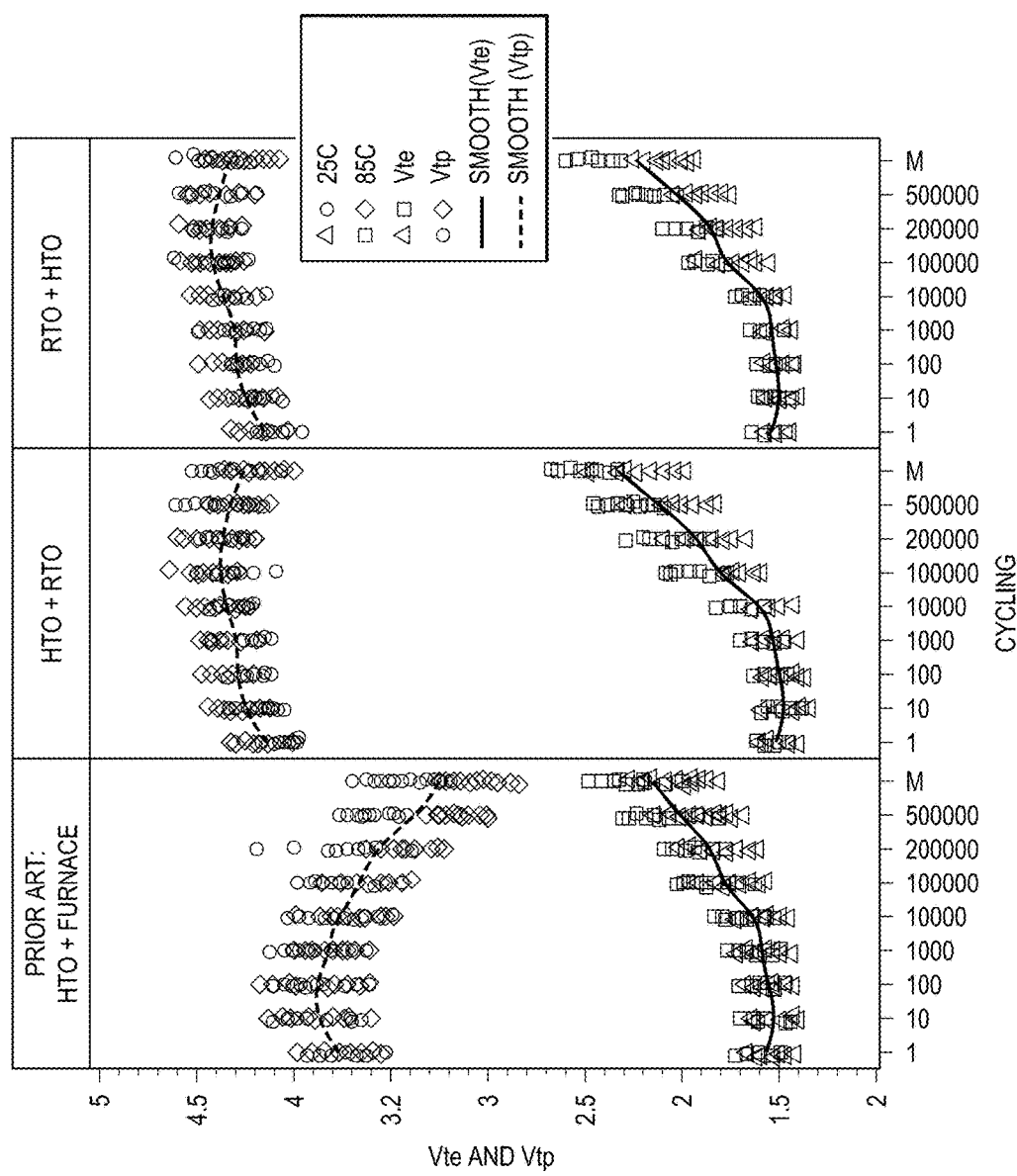
FIG. 7 illustrates example endurance testing results for EEPROM cells having a sidewall oxide produced by (a) a prior art technique of oxide deposition plus furnace annealing, (b) the method shown in FIGS. 5A-5D (HTO followed by RTO), and (c) the method shown in FIGS. 6A-6D (RTO followed by HTO).

FIG. 7 illustrates three graphs arranged side-by-side showing example endurance testing results for EEPROM cells having a sidewall oxide produced by (a) left-side graph: a prior art technique of oxide deposition plus furnace annealing, (b) center graph: the method shown in FIGS. 5A-5D (HTO followed by RTO), and (c) right-side graph: the method shown in FIGS. 6A-6D (RTO followed by HTO).

As shown, the endurance performance, especially the Vtp high-margin degradation with endurance cycling at both 25° C. and 85° C., are improved in the memory cells produced using the sidewall oxide formation methods discussed above, as compared with memory cells using a prior art sidewall oxide formation process of applying an HTO followed by a furnace anneal.

Figure 8:
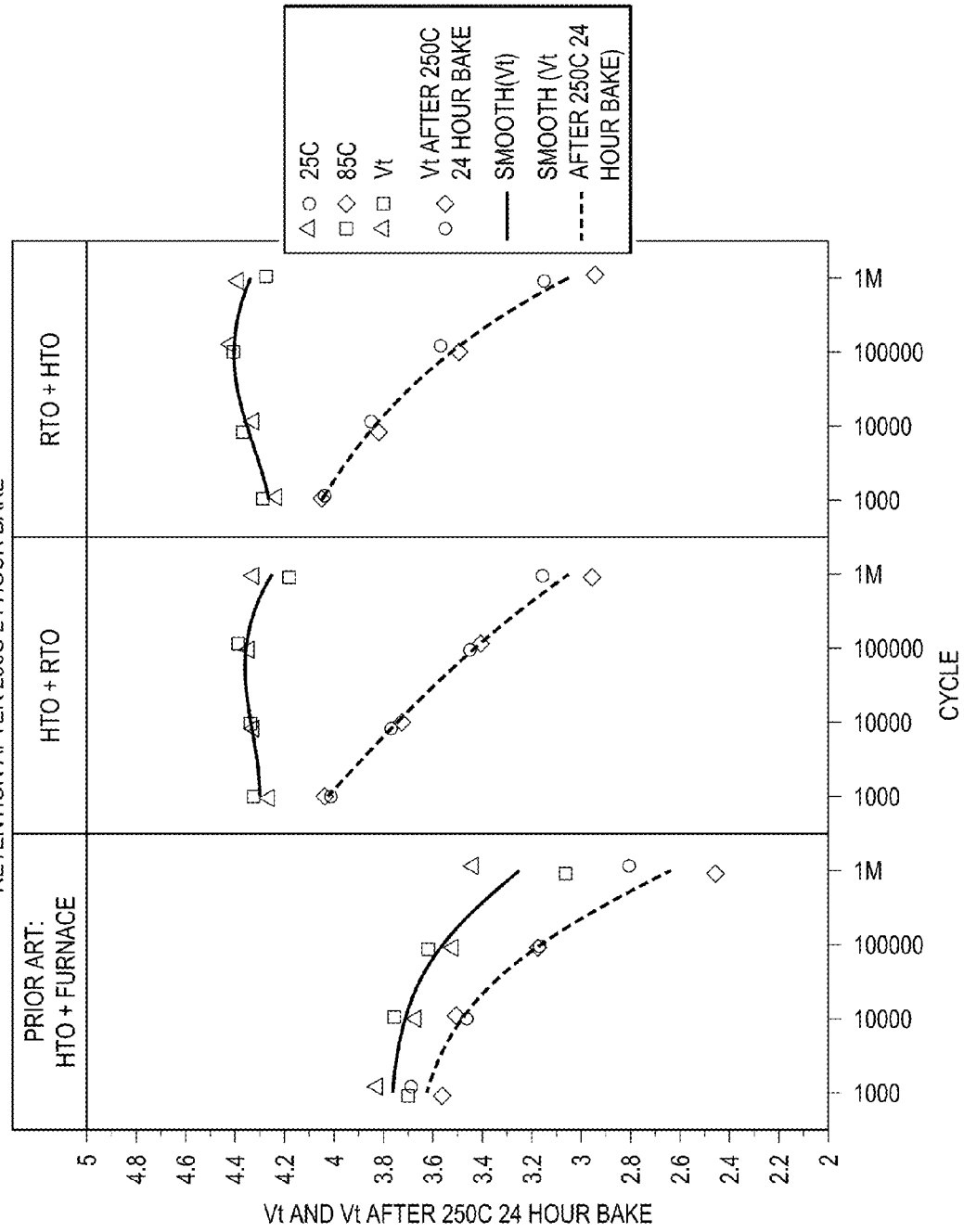
FIG. 8 illustrates example data retention testing results for EEPROM cells having a sidewall oxide produced by (a) a prior art technique of oxide deposition plus furnace annealing, (b) the method shown in FIGS. 5A-5D (HTO followed by RTO), and (c) the method shown in FIGS. 6A-6D (RTO followed by HTO).

FIG. 8 illustrates three graphs arranged side-by-side showing example data retention testing results for EEPROM cells having a sidewall oxide produced by (a) left-side graph: a prior art technique of oxide deposition plus furnace annealing, (b) center graph: the method shown in FIGS. 5A-5D (HTO followed by RTO), and (c) right-side graph: the method shown in FIGS. 6A-6D (RTO followed by HTO).

As shown, the data retention performance is improved in the memory cells produced using the sidewall oxide formation methods discussed above, as compared with memory cells using a prior art sidewall oxide formation process of applying an HTO followed by a furnace anneal.

Figure 9:
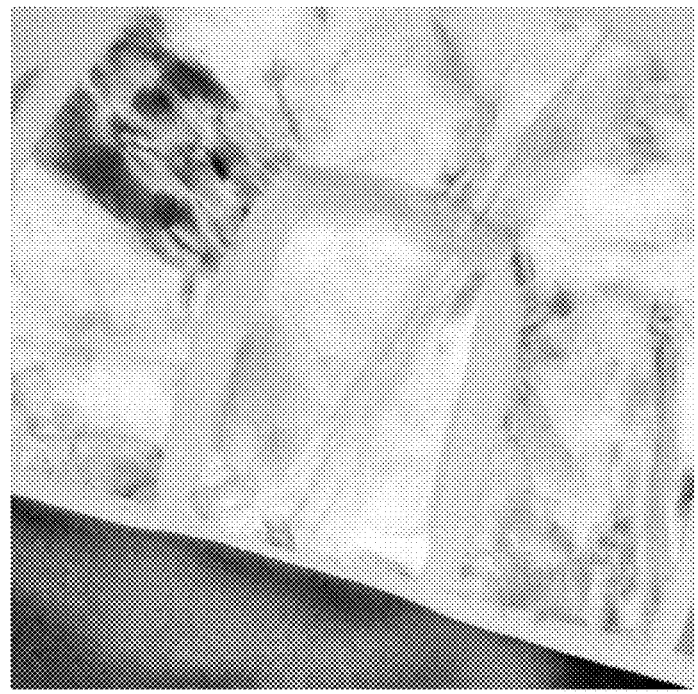
FIG. 9 is a TEM image of an example EEPROM structure including a floating gate and sidewall oxide produced by the method shown in FIGS. 5A-5D (HTO followed by RTO).

FIG. 9 is a TEM image of an example EEPROM structure including a floating gate and sidewall oxide produced by the method shown in FIGS. 5A-5D (HTO followed by RTO).

Figure 10:
FIG. 10 is a TEM image of an example EEPROM structure including a floating gate and sidewall oxide produced by the method shown in FIGS. 6A-6D (RTO followed by HTO).

FIG. 10 is a TEM image of an example EEPROM structure including a floating gate and sidewall oxide produced by the method shown in FIGS. 6A-6D (RTO followed by HTO).

Figure 1:
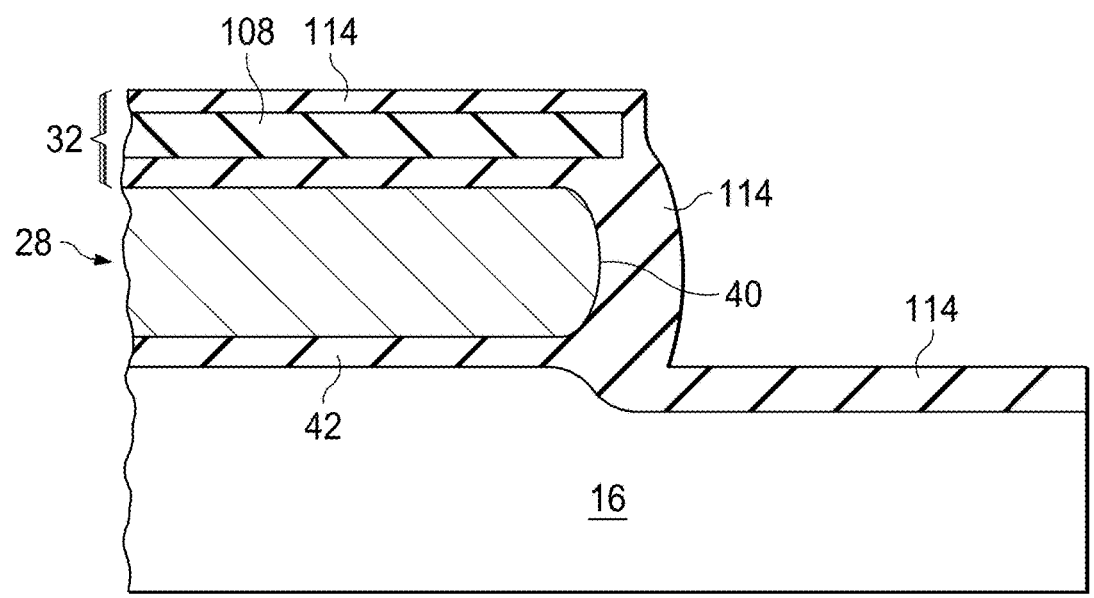
FIG. 1 shows a partial cross-sectional representation of a conventional EEPROM cell, showing a floating gate, ONO layer, and sidewall oxide covering a side of the floating gate.
Figure 2:
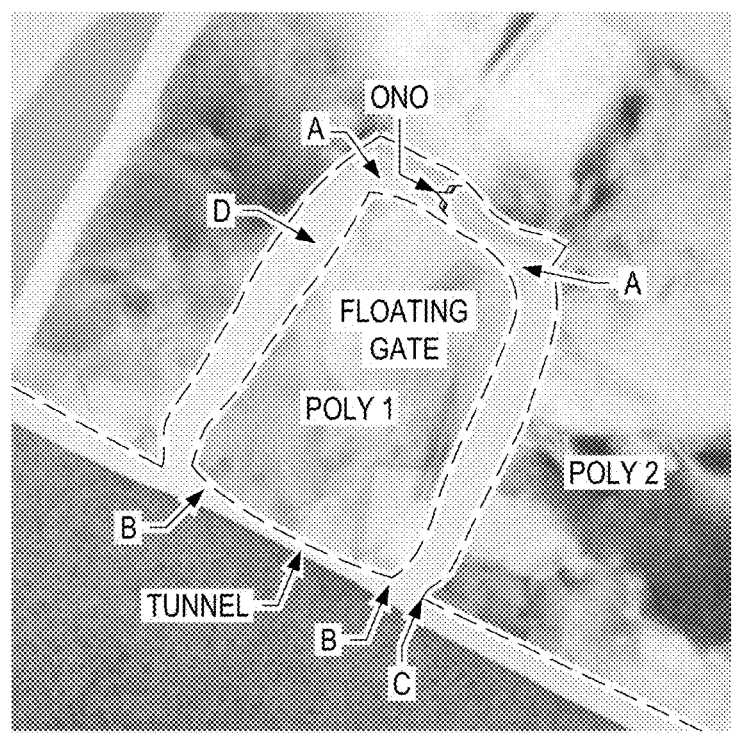
FIG. 2 is an image of an example EEPROM structure exhibiting various undesirable features resulting from a known process for forming a sidewall oxide on the floating gate.

As can be seen by comparing FIG. 9 (HTO followed by RTO) and FIG. 10 (RTO followed by HTO) with prior art FIG. 2 (HTO followed by furnace anneal), the structures resulting from the presently disclosed sidewall oxide formation processes (FIGS. 9 and 10) exhibit less lateral oxide encroachment into the ONO and tunnel oxide channel, a more uniform sidewall oxide thickness adjacent the floating gate sidewall, and less sharp corners at the base of the polysilicon control gate, which differences provide improved memory cell performance over the prior art.

In summary, a conventional two-step furnace sidewall oxide process causes performance problems on advanced EEPROM cells due to severe lateral encroachment under the ONO and channel. The presently disclosed process solutions replace the furnace oxidation with a RTO anneal process, either before or after the HTO oxide deposition. The presently disclosed may preserve more of the poly 1 (floating gate), provide a more uniform sidewall oxide, cause less lateral oxide encroachment underneath the ONO and tunnel channel, and have less sharp poly corners. Further, the disclosed solutions may be less expensive and simpler to implement than other prior art solutions and have better memory endurance and data retention reliability.

While the example embodiments discussed above involve the fabrication of p-channel cells, those of ordinary skill in the art will appreciate that the present invention is equally applicable to n-channel cells. It should further be recognized that embodiments of the present invention are independent of the method of programming and erasing the memory cell.

Furthermore, the present invention is applicable to other split-gate cells in EEPROM devices and other memory cells in general. In addition, those of ordinary skill in the art should appreciate that other process steps (not forming a part of the present invention) are involved in fabrication of a memory cell than those explicitly described herein. Thus, the example embodiments disclosed above may be altered or modified and all such variations are considered within the scope and spirit of the invention.

The invention claimed is:

1. A method of fabricating a memory cell of a semiconductor device, the method comprising:
   depositing a conductive layer having a top surface and a side surface;
   forming a partial ONO layer over the top surface of the conductive layer by depositing a first oxide layer on the top surface of the conductive layer and a silicon nitride layer on top of the first oxide layer, wherein the side surface of the conductive layer remains exposed; and
   forming a sidewall oxide layer adjacent the side surface of the conductive layer by a process including:
   depositing a high temperature oxide (HTO) film directly on the side surface of the conductive layer and on top of the silicon nitride layer thereby forming the ONO layer; and
   performing a rapid thermal oxidation (RTO) anneal.

2. The method of claim 1, wherein the sidewall oxide layer is formed by depositing the HTO film on the side surface of the conductive layer and subsequently performing the RTO anneal of the deposited HTO film.

3. The method of claim 1, wherein the deposited HTO film has a thickness in a range of 50-120 Å.

4. The method of claim 1, wherein the deposited HTO film has a thickness in a range of 60-80 Å.

5. The method of claim 1, wherein the RTO anneal is performed in a dry O2 environment, in a temperature range of 1000° C.-1200° C. for a duration in the range of 25-60 sec.

6. The method of claim 1, wherein the RTO anneal is performed in a dry O2 environment, in a temperature range of 1050° C.-1150° C. for a duration in a range of 30-40 sec.

7. The method of claim 1, wherein the sidewall oxide layer is formed by performing the RTO anneal of the conductive layer and the partial ONO layer, and after the RTO anneal, depositing the HTO film over the side surface of the conductive layer.

8. The method of claim 7, wherein:
   the RTO anneal oxidizes the exposed side surface of the conductive layer, and
   the HTO film is deposited on the oxidized side surface of the conductive layer.

9. A method of fabricating a memory cell of a semiconductor device, the method comprising:
   forming a stack structure on a wafer by:
   depositing a conductive layer on a first oxide layer;
   forming a second oxide layer over a top surface of the conductive layer,
   forming a silicon nitride layer over the top surface of the first oxide layer, and
   forming and patterning a protective photoresist layer silicon nitride layer and performing an etching down to the first oxide layer, wherein a side surface of the conductive layer remains exposed;
   depositing a high temperature oxide (HTO) film immediately on the side surface of the conductive layer and on top of the silicon nitride layer; and
   performing a rapid thermal oxidation (RTO) anneal.

10. The method of claim 9, wherein a sidewall oxide layer is formed by depositing the HTO film on the side surface of the conductive layer and subsequently performing the RTO anneal of the deposited HTO film.

11. The method of claim 9, wherein the deposited HTO film has a thickness in a range of 50-120 Å.

12. The method of claim 9, wherein the deposited HTO film has a thickness in a range of 60-80 Å.

13. The method of claim 9, wherein the RTO anneal is performed in a dry O2 environment, in a temperature range of 1000° C.-1200° C. for a duration in the range of 25-60 sec.

14. The method of claim 9, wherein the RTO anneal is performed in a dry O2 environment, in a temperature range of 1050° C.-1150° C. for a duration in a range of 30-40 sec.

15. The method of claim 9, wherein the second oxide layer has a thickness between 60-120 Å and the silicon nitride layer has a thickness between 60-200 Å.

16. The method of claim 9, wherein a sidewall oxide layer is formed by performing the RTO anneal of the stack structure, and after the RTO anneal, depositing the HTO film over the side surface of the conductive layer.

17. The method of claim 16, wherein:
the RTO anneal oxidizes the side surface of the conductive layer, and
the HTO film is deposited on the oxidized side surface of the conductive layer.

18. The method of claim 9, further comprising the step of cleaning the wafer after forming the stack structure.

19. The method of claim 9, wherein a total thickness of an oxide layer following the RTO anneal is between 50 and 120 Å on top of the silicon nitride layer, between 100 and 500 Å on the side surface of the conductive layer, and between 100 and 300 Å above a substrate.

* * * * *